United States Patent [19]
Kawata et al.

[11] Patent Number: 5,969,362
[45] Date of Patent: Oct. 19, 1999

[54] HIGH-THROUGHPUT DIRECT-WRITE ELECTRON-BEAM EXPOSURE SYSTEM AND METHOD

[75] Inventors: Shintaro Kawata, Ibaragi-ken; Kazuya Okamoto, Yokohama, both of Japan

[73] Assignee: Nikon Corporation, Tokyo, Japan

[21] Appl. No.: 09/030,653

[22] Filed: Feb. 5, 1998

[30] Foreign Application Priority Data

Feb. 25, 1997 [JP] Japan .................................. 9-055403

[51] Int. Cl.⁶ ............................ H01J 37/30; H01J 37/14
[52] U.S. Cl. ................... 250/398; 250/492.2; 250/423 F
[58] Field of Search ........................ 250/396 ML, 398, 250/492.2, 492.24, 492.3, 423 F

[56] References Cited

U.S. PATENT DOCUMENTS

| | | | |
|---|---|---|---|
| 3,551,734 | 12/1970 | O'Keeffe et al. | 250/492.24 |
| 4,153,843 | 5/1979 | Pease | 250/492.2 |
| 4,227,090 | 10/1980 | Amboss | 250/492.24 |
| 4,663,559 | 5/1987 | Christensen | 313/336 |
| 4,705,956 | 11/1987 | Ward | 250/492.24 |
| 4,742,234 | 5/1988 | Feldman et al. | 250/398 |
| 4,798,959 | 1/1989 | Marks | 250/398 |
| 5,003,178 | 3/1991 | Livesay | 250/423 F |
| 5,363,021 | 11/1994 | MacDonald | 250/396 R |
| 5,455,427 | 10/1995 | Lepselter et al. | 250/396 R |
| 5,723,867 | 3/1998 | Imura | 250/423 F |

OTHER PUBLICATIONS

Saville, Gordon F., et al., *Magnetic Funnels for Projection Electron Lithography*, American Vacuum Society, J. Vac. Sci. Technol. B 13(6), Nov/Dec 1995, pp. 2424–2427.

Chang, T. H. P., et al., *Arrayed Miniature Electron Beam Columns for High Throughput Sub–100 nm Lithography*, American Vacuum Society, J. Vac. Sci. Technol. B 10(6), Nov/Dec 1992, pp. 2743–2748.

*Primary Examiner*—Bruce C. Anderson
*Attorney, Agent, or Firm*—Klarquist Sparkman Campbell Leigh & Whinston, LLP

[57] ABSTRACT

An electron-beam exposure system includes: (1) a stage for supporting a wafer, (2) a planar electron-beam source that emits multiple electron beamlets toward the stage, (3) an electric-field generator for forming an electric field to accelerate the electrons in the electron beamlets, (4) a magnetic-field generator for forming a magnetic flux in the space between the planar electron-beam source and the wafer stage. The magnetic filed generator is structured and arranged such that the magnetic flux formed thereby is (1) substantially evenly distributed within a plane perpendicular to the optical axis, and (2) of increasing flux density, ranging from a first density in the vicinity of the planar electron-beam source, to a second density (greater than the first density) in the vicinity of the wafer stage. The electrons in the electron beamlets follow the lines of magnetic flux such that the beamlet width is decreased at the stage compared to the beamlet width at the planar electron-beam source. The electron beamlets are preferably individually switchable, on and off, by word lines and bit lines on the planar electron-beam source. To form a desired pattern on a wafer surface, the stage is moved through a small area, while the electron beamlets are modulated as needed to write the desired pattern.

24 Claims, 1 Drawing Sheet

HIGH-THROUGHPUT DIRECT-WRITE ELECTRON-BEAM EXPOSURE SYSTEM AND METHOD

FIELD OF THE INVENTION

This invention relates to electron-beam exposure systems that are suitable for forming high-density minute patterns, such as for integrated circuits, and particularly to electron-beam exposure systems having high throughput rates yet requiring no reticle or mask or the like.

BACKGROUND OF THE INVENTION

Traditional direct-write electron-beam exposure systems use an electron source substantially in the form of a point source. In these systems, typically, a minimum cross-section electron beam, produced from a point source, is deflected so as to scan across the surface of a sample. The deflected beam writes a pattern on the surface of the sample in a single, continuous stroke. Such systems are not practical for use in high-volume production of integrated circuits, because the throughput rate is too low.

To improve the throughput rate, multi-column type electron-beam exposure systems have been proposed by, for example, Chang, et al., in "Arrayed Miniature Electron Beam Columns for High Throughput Sub-100 nm Lithography," *J. Vac. Sci. Technol. B* 10:2743–2748, November/December 1992. In this proposal, it is asserted that, at a line width of 100 nm, a throughput rate of fifty 200-mm wafers (60 chips each) per hour or more could be achieved if 10 columns (each including an electron source, lens and deflector) are provided for every 20 mm×20 mm chip.

In a multiple-column type electron-beam exposure system, numerous columns are required. The inter-column distance, however, likely cannot be made as close as asserted in Chang, et al., because of the space requirements of the individual lenses and deflectors for each column. A very high throughput rate (as predicted on the assumption of 10 columns per 20-mm chip) would thus not be anticipated.

OBJECTS AND SUMMARY OF THE INVENTION

The electron-beam exposure system of the present invention has a planar electron-beam source containing multiple sources at a high density. The system of the present invention provides a direct-write electron-beam exposure system having a high throughput rate.

The electron-beam exposure system of the present invention includes: (1) a stage for supporting a wafer, (2) a planar electron-beam source that emits multiple electron beamlets toward the stage, (3) an electric-field generator for forming an electric field to accelerate the electrons in the electron beamlets, (4) a magnetic-field generator for forming a magnetic flux in the space between the planar electron-beam source and the wafer stage.

The magnetic field generator is structured and arranged such that the magnetic flux formed thereby is (1) substantially evenly distributed within a plane perpendicular to the optical axis in the vicinity of the planar electron-beam source, and (2) of increasing flux density, ranging from a first density in the vicinity of the planar electron-beam source, to a second density (greater than the first density) in the vicinity of the wafer stage.

The electrons of the electron beamlets follow the lines of magnetic flux such that the beamlet width is decreased at the stage compared the beamlet width at the planar electron-beam source. The electron beamlets are preferably individually switchable, on and off, by word lines and bit lines on the planar electron-beam source. To form a desired pattern on a wafer surface, the stage is moved through a small area, while the electron beamlets are modulated as needed to write the desired pattern.

DETAILED DESCRIPTION

Figure 1:
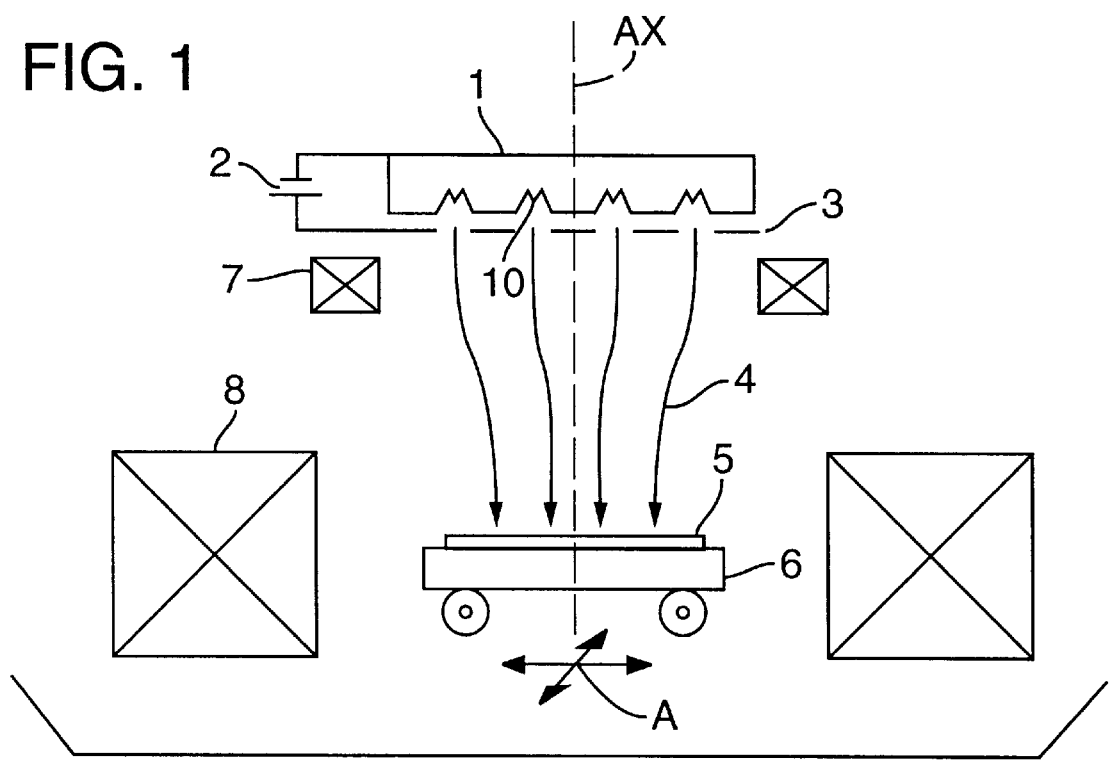
FIG. 1 is an elevational schematic diagram of a preferred embodiment of an electron-beam exposure system of the present invention.

FIG. 1 is an elevational schematic diagram showing a preferred embodiment of an electron-beam exposure system of the present invention. The electron-beam exposure system of FIG. 1 includes a resonance tunnelling type planar electron-beam source 1 comprising multiple individual electron-beam sources 10. The planar electron-beam source 1 is preferably 40×40 mm square.

Figure 2:
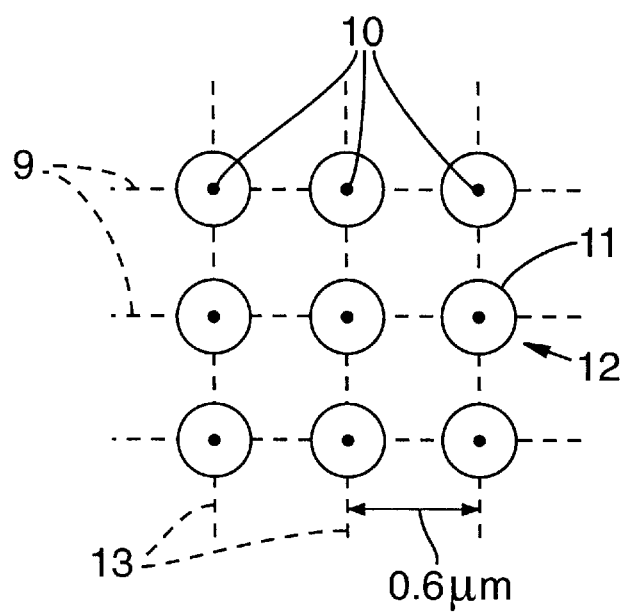
FIG. 2 is a plan view of the planar electron source of the electron-beam exposure system of FIG. 1.

The individual electron-beam sources 10 are arranged in a matrix pattern at a 0.6 $\mu$m pitch on a side of the planar electron-beam source 1 facing toward a wafer stage 6. The individual electron-beam sources 10 are formed by a conventional method and with conventional material, to be explained below. As may be seen in FIG. 2, each individual electron-beam source 10 includes a crater (hole) 11, 0.6 $\mu$m or less in diameter, with a sharp peak (electron-emitting area) 12 at the center of the hole. Each individual electron source 10 has a word line 9 and a bit line 13 wired to it, by means of which a voltage imposed on each individual electron source 10 can individually be turned on and off, thereby turning on and off the emission of an electron beamlet 4.

The planar electron-beam source is utilized in a high vacuum of $10^{-5}$ Pa or less. An electric field generator is employed to accelerate the electrons in the electron beamlets 4. The generator may be in the form of an accelerating electrode (anode) 3, that is positioned between the planar electron-beam source 1 and the wafer stage 6, parallel to the bottom surface of the planar electron-beam source 1, but separated therefrom by a gap of, for example, 10 mm. Such an accelerating anode 3 has an opening therethrough immediately under each individual electron-beam source 10. An accelerating voltage (100 kV, for example) is imposed between the accelerating electrode 3 and the planar electron-beam source 1 by a high-voltage DC power supply 2, with the accelerating electrode being positive relative to the planar electron-beam source 1.

Individual electron beamlets 4 are radiated from the individual electron-beam sources 10 of the planar electron-beam source 1 when a voltage of several tens of volts is imposed on an extractor electrode (not shown) of the planar electron-beam source 1. The beamlets 4 are accelerated (downward in the figure) from the planar electron-beam source 1 toward the stage 6 by the effect of the electric field (or potential difference) caused by the voltage imposed on the accelerating electrode 3. The diameter of an electron beamlet 4 in the vicinity of the planar electron-beam source 1 and accelerating electrode 3 is 0.1 $\mu$m or less.

A wafer 5 is loaded on the stage 6 under the planar electron-beam source 1. The stage 6 is movable in an X-Y plane (arrows A) perpendicular to the direction of travel of the beamlets 4. The position of the stage 6 in the X-Y plane may be detected, at an accuracy of 0.005 μm, by a laser interferometer (not shown).

The system of this invention further includes a magnetic-field generator, comprising, in this embodiment, a first coil 7 and a second coil 8, each extending around a space located between the planar electron-beam source 1 and the stage 6. The magnetic flux density M produced at the stage 6 (and the wafer 5) by the coils 7, 8 (substantially by the coil 8 alone) is greater than the magnetic flux density m produced by the coils 7, 8 (substantially by the coil 7 alone) at or near the planar electron source 1. For example, M may be 4 T while m may be 1 T. Together, the coils 7 and 8 operate to form a magnetic flux throughout the space between the planar electron-beam source 1 and the stage 6 (and the wafer 5). The magnetic flux is substantially uniformly distributed in a plane perpendicular to the optical axis AX, and the increase in density (from m to M) of the magnetic flux from the planar electron-beam source 1 to the stage 6 (and wafer 5) is substantially linear. The density ratio M/m may be varied by changing the density of the magnetic flux produced by the coil 7 the density of the magnetic flux produced by the coil 8, or both. The flux-density increase varies directly with the ratio, and the linear density changes with the square root of the ratio. (The uniformity of the magnetic flux produced by existing high-uniformity magnets can been held to 0.01% or better.) (For further discussion of such compression of a uniform magnetic field, as applied in the case of projection electron lithography, see Saville and Platzman, "Magnetic Funnels for Projection Electron Lithography," *J. Vac. Sci. Technol. B* 13:2424–2427, November/December 1995, incorporated herein by reference.)

The magnetic field formed by the coils 7, 8 causes each electron beamlet 4 from the individual electron-beam sources 10 to propagate to the wafer 5 along a trajectory in which the constituent electrons spiral around a respective line of magnetic flux. As each beamlet propagates, the transverse area of the beamlet is compressed to m/M (e.g., ¼) of its original transverse area, or reduced to (m/M) ½ (e.g., ½) of its original transverse width. Thus, exposure spots of half the original beamlet diameter (e.g., about 0.05 μm or less) may be formed on a resist layer on the top surface of the wafer 5 by the electron beamlets.

With the above-described arrangement, it is possible to draw a pattern filling an entire 20 mm×20 mm area on the wafer 5 (as in a 20 mm×20 mm chip) by moving the stage 6 in a 0.5-μm square while irradiating the wafer 5 with the electron beamlets 4. The exposure patterning is accomplished by turning each electron source on and off as controlled by electrical signals delivered to the electron sources by the word lines and bit lines. The required drawing time is very short: only 25 μs is required to expose a 20-mm square on a wafer, if an individual electron-source current of 1 nA and a resist dose level of 10 μC/cm$^2$ are assumed. If such a fast speed is not required, the density of individual electron-beam sources on the planar electron-beam source may be reduced, e.g., to a 5 μm pitch, or to a 20 μm pitch.

The planar electron-beam source (a resonant tunnelling type electron source) is preferably configured with a super-lattice structure of γ-Al$_2$O$_3$ film, which is grown by MBE (molecular beam epitaxy), on a silicon substrate. It is preferably manufactured by a method as disclosed in J. Ito and M. Kanamaru, "Bishou reiinnkyoku no ouyou", *Optronics* 1991.1, pp. 193–198, and in the abstract of "the 56th Autumm Meeting of the Japan Society of Applied Physics" 1995 Kanazawa, Japan, 29a-ZT-9--11, 29p-ZT-1. High-resolution patterning is possible because of the small energy dispersion (about ±0.1 eV), and also the small angular dispersion (about 1 mrad), of this tunnelling-type electron source. By employing such a source in the FIG. –1 embodiment, patterns with feature sizes as small as 0.07 μm can be formed.

As is evident in the foregoing description, this invention provides an electron-beam exposure system that is suitable for drawing high-density, minute patterns. In particular, this invention provides an electron-beam exposure system of revolutionary characteristics: high throughput rate with no requirement for a mask or reticle.

Having illustrated and demonstrated the principles of the invention, it should be apparent to those skilled in the art that the embodiments of the invention can be modified in arrangement and detail without departing from such principles. For example, while the electron-beam exposure system of this invention is intended primarily as a direct-write system, it may also be applied to systems for exposing a pattern defined by a reticle, if desired. I claim as the invention all that comes within the scope of the following claims.

What is claimed is:

1. An electron-beam exposure system, comprising:
   (a) a wafer stage;
   (b) a planar electron-beam source structured and positioned for emitting a plurality of electron beamlets toward the wafer stage in a direction parallel to an optical axis;
   (c) an electrical field generator situated relative to the planar electron-beam source so as to accelerate electrons in the beamlets from the planar electron-beam source toward the wafer stage; and
   (d) a magnetic field generator situated so as to form a magnetic flux in a region between the planar electron-beam source and the wafer stage, the flux being (1) substantially uniformly distributed within a plane, perpendicular to the optical axis, in the vicinity of the planar electron-beam source, and within a plane, perpendicular to the optical axis, in the vicinity of the stage, and (2) of increasing flux density, from a first density in the vicinity of the planar electron-beam source, to a second density in the vicinity of the wafer stage, greater than the first density.

2. The electron-beam exposure system of claim 1, wherein the planar electron-beam source comprises (1) multiple individual electron sources, each for emitting an electron beamlet, and (2) a respective switch for controlling each individual electron source to either emit or not emit an electron beamlet.

3. The electron-beam exposure system of claim 2, wherein the wafer stage is movable so as to scan the wafer in a plane perpendicular to the optical axis.

4. The electron-beam exposure system of claim 2, wherein the individual electron-beam sources are arranged in a regularly spaced, two-dimensional array in a plane perpendicular to the optical axis.

5. The electron-beam exposure system of claim 4, wherein each individual electron-beam source in the array is spaced 20 μm or less from an adjacent electron-beam source in the array.

6. The electron-beam exposure system of claim 5, wherein each individual electron-beam source in the array is spaced 5 μm or less from an adjacent electron-beam source in the array.

7. The electron-beam exposure system of claim 6, wherein each individual electron-beam source in the array is spaced 0.6 μm or less from an adjacent electron-beam source in the array.

8. The electron-beam exposure system of claim 1, wherein the planar electron-beam source is a resonance-tunnelling type.

9. The electron-beam exposure system of claim 8, wherein the planar electron-beam source comprises a γ-Al$_2$O$_3$ superlattice.

10. The electron-beam exposure system of claim 9, wherein the γ-Al$_2$O$_3$ superlattice comprises an MBE-deposited film.

11. The electron-beam exposure system of claim 9, wherein the planar electron-beam source comprises a γ-Al$_2$O$_3$ superlattice on a silicon substrate.

12. The electron-beam exposure system of claim 1, wherein the electrical-field generator comprises an electrode positioned between the planar electron-beam source and the stage.

13. The electron-beam exposure system of claim 12, wherein the electrode is planar, substantially parallel to the planar electron-beam source, and positioned about 10 mm from the planar electron-beam source.

14. The electron-beam exposure system of claim 1, wherein the magnetic-field generator comprises first and second coils, the first coil positioned in the vicinity of the planar electron-beam source and the second coil positioned in the vicinity of the stage, the second coil producing a denser magnetic flux than the first coil.

15. The electron-beam exposure system of claim 14, wherein the magnetic flux density produced by the first coil is approximately ¼ the magnetic flux density produced by the second coil.

16. The electron-beam exposure system of claim 1, wherein the planar electron-beam source emits beamlets each having an energy dispersion of about +0.1 eV or less, and an angular dispersion of about 1 mrad or less.

17. A method of high-throughput direct-write electron-beam exposure, comprising the steps of:
 (a) providing a wafer stage, a planar electron-beam source for emitting a plurality of electron beamlets toward the stage, and a magnetic field generator for generating a magnetic field in the space between the planar electron-beam source and the wafer stage;
 (b) positioning a wafer on the wafer stage; and
 (c) causing the planar electron-beam source to emit a plurality of electron beamlets toward the wafer while generating a magnetic field with the magnetic field generator, the generated magnetic field being substantially evenly distributed within a plane parallel to the surface of the wafer, and being of increasing flux density, from the density in the vicinity of the planar electron-beam source, to the density in the vicinity of the wafer stage.

18. The method of claim 17, further comprising the step of moving the wafer stage within a plane parallel to the surface of the wafer.

19. The method of claim 18, further comprising the step of turning on and off, individually, the electron beamlets being emitted from the planar electron-beam source, so as to expose on the wafer a desired pattern.

20. The method of claim 17, further comprising the steps of (1) providing an accelerating electrode for generating an electric field to accelerate the electrons in the electron beamlets emitted by the planar electron-beam source and (2) applying a positive voltage potential, relative to the potential of the planar electron-beam source, to the accelerating electrode.

21. The method of claim 20, wherein the positive voltage potential is about 100 V.

22. A method for performing high-throughput electron-beam exposure of a sensitive substrate, comprising the steps:
 (a) emitting multiple electron beamlets in a propagation direction toward a surface after substrate;
 (b) accelerating the beamlets as the beamlets propagate toward the substrate surface;
 (c) passing the beamlets through a magnetic field that increases in magnetic-flux density as the beamlets propagate nearer to the substrate surface and that is substantially uniformly distributed in a plane transverse to the propagation direction, thereby laterally compressing each beamlet; and
 (d) causing multiple compressed beamlets to simultaneously expose multiple respective regions of the substrate surface.

23. The method of claim 22, wherein step (a) comprises emitting the electron beamlets from a planar electron-beam source.

24. The method of claim 23, wherein step (d) comprises individually modulating each beamlet as each beamlet exposes a respective region of the substrate surface.

* * * * *

UNITED STATES PATENT AND TRADEMARK OFFICE
CERTIFICATE OF CORRECTION

PATENT NO. : 5,969,362
DATED : Oct. 19, 1999
INVENTOR(S) : Kawata et al

It is certified that error appears in the above-identified patent and that said Letters Patent is hereby corrected as shown below:

On the cover page, "[22] Filed: Feb. 5, 1998" should be
--[22] Filed: Feb. 25, 1998--.

Signed and Sealed this

Twenty-second Day of February, 2000

Attest:

Q. TODD DICKINSON

*Attesting Officer*     *Commissioner of Patents and Trademarks*